United States Patent
Baudelocque et al.

(10) Patent No.: US 9,660,374 B2
(45) Date of Patent: May 23, 2017

(54) SEALED ELECTRICAL CONNECTOR FOR MAGNETIC BEARINGS

(71) Applicant: Aktiebolaget SKF, Göteborg (SE)

(72) Inventors: Luc Baudelocque, Vernon (FR); David Moulin, Montrouge (FR); Mohamed Bendaoud, Fontaine-Heudebourg (FR); Bruno Tellier, Saint-Marcel (FR)

(73) Assignee: AKTIEBOLAGET SKF, Gothenburg (SE)

( * ) Notice: Subject to any disclaimer, the term of this patent is extended or adjusted under 35 U.S.C. 154(b) by 292 days.

(21) Appl. No.: 13/951,975

(22) Filed: Jul. 26, 2013

(65) Prior Publication Data

US 2014/0030902 A1    Jan. 30, 2014

(30) Foreign Application Priority Data

Jul. 27, 2012  (FR) ...................................... 12 57339

(51) Int. Cl.
*H01R 13/52*     (2006.01)
*H01R 13/533*    (2006.01)

(52) U.S. Cl.
CPC ..... *H01R 13/5205* (2013.01); *H01R 13/5202* (2013.01); *H01R 13/5208* (2013.01); *H01R 13/533* (2013.01)

(58) Field of Classification Search
CPC ............ H01R 13/5205; H01R 13/5208; H01R 13/5202; H01R 13/533
USPC ........................................ 174/653; 439/271
See application file for complete search history.

(56) References Cited

U.S. PATENT DOCUMENTS

| | | | |
|---|---|---|---|
| 4,032,214 A |   | 6/1977 | McNerney |
| 5,685,727 A | * | 11/1997 | Cairns ........................... 439/139 |
| 6,676,447 B1 | * | 1/2004 | Knox .............................. 439/587 |
| 8,267,707 B2 | * | 9/2012 | Rogers ........................... 439/271 |

(Continued)

FOREIGN PATENT DOCUMENTS

| | | |
|---|---|---|
| EP | 1395759 A1 | 3/2004 |
| EP | 2410533 A1 | 1/2012 |

(Continued)

*Primary Examiner* — William H Mayo, III
*Assistant Examiner* — Hiram E Gonzalez
(74) *Attorney, Agent, or Firm* — Bryan Peckjian; SKF USA Inc. Patent Dept.

(57) ABSTRACT

An electrical connector providing a sealed electrical link between an inside environment subjected to corrosive gases or liquids under pressure and an outside environment of different pressure. The connector includes a connector body, conductor cables, a thermoplastic insulator, and a sealing element. The connector body is secured to a structure and includes insulating feed-throughs for receiving electrical contacts connecting an outside environment to an inside environment. The conductor cables, comprising an outer insulating layer made of a fusible thermoplastic material, are connected to said electrical contacts inside said inside environment. The thermoplastic insulator is secured to said connector body and surrounds the conductor cables. The thermoplastic insulator and cable outer insulating layers are made of a same type of fusible thermoplastic material making it possible, by localized fusion, to form a thermoplastic weld therebetween. The sealing element is mounted between the connector body and the thermoplastic insulator.

17 Claims, 3 Drawing Sheets

(56) References Cited

U.S. PATENT DOCUMENTS

| | | | |
|---|---|---|---|
| 8,292,645 B2 * | 10/2012 | Cairns | 439/271 |
| 8,512,074 B2 * | 8/2013 | Frey | 439/589 |
| 8,944,082 B2 * | 2/2015 | Cairns | 137/1 |
| 2008/0153333 A1 * | 6/2008 | Dubranna | 439/271 |

FOREIGN PATENT DOCUMENTS

| | | | |
|---|---|---|---|
| FR | 2861142 A1 | 4/2005 | |
| FR | 2956535 A1 | 8/2011 | |

\* cited by examiner

SEALED ELECTRICAL CONNECTOR FOR MAGNETIC BEARINGS

CROSS-REFERENCE TO RELATED APPLICATION

This application is a U.S. Non-Provisional Utility Patent Application claiming the benefit of France Patent Application Number 1257339 filed on 27 Jul. 2012, which is incorporated herein in its entirety.

TECHNICAL FIELD

The present invention relates to the field of magnetic bearings for rotary machines and it relates more particularly to a sealed electrical connector for such machines, in which it is necessary to have a large pressure difference between the inside environment (process environment) and the outside environment (ambient environment).

BACKGROUND ART

Magnetic bearings are used in industry to enable the rotor of a rotary machine to rotate in contactless manner. A magnetic bearing may be used directly in environments for processing and/or extracting gases that are under pressure, corrosive, and hot. On the stator, such a bearing is made up of stacks of magnetic laminations on which the electrical coils are placed that are used for generating the magnetic field necessary for levitation of the rotor. That type of machine is well known and described, for example, in Patent EP 1 395 759 filed in the name of the Applicant. Since the resulting assembly is for placing in the potentially electrically conductive flow of corrosive gas, it is necessary to protect the copper conductors of the electrical coils from the environment, and to insulate the copper wires from one another and from ground.

The compatibility of the insulation of the copper wires with the environment is a recurrent problem in industrial applications, in particular in gas fields in which the composition of the gas can vary over time and cannot be kept fully under control. In addition, adding process fluid, e.g. monoethylene glycol, can degrade the quality of the insulation and cause a failure in the rotary machine as a whole. In addition, connections between coils are necessary in order to implement the electrical circuit of the machine, but such connections represent weak points in the electrical insulation, because, under pressure, they might be grounded by fluid finding its way to the copper conductor. Such grounding should be avoided at all cost because it causes total system failure, and thus causes the machine to shut down.

One solution to that problem of insulating electrical connections consists in using insulation made up of various taped, non-sealed layers that are impregnated with an electrical insulation resin that is typically an epoxy resin. The purpose of that resin is to insulate the connection electrically from the surrounding environment, and to protect the copper conductors of said connection chemically from the corrosive gas by serving as a mechanical barrier.

In view of the wide variety of chemical atmospheres, of pressures, and of temperatures encountered in industrial applications, it is very difficult to find an impregnation resin that can withstand such a variety of stresses. In addition, in view of the difficulty of identifying all of the degradation phenomena of known electrical resins and of their interactions with the elements of the gas, validation of the chemical protection requires testing that is complex and costly to put in place, on installations that are, in practice, not very commonplace.

That is why, in its Application EP 2 410 533, the Applicant proposes that this conventional principle of protecting conductor wires with impregnation resin be replaced with an insulation system that is extruded directly over each conductor wire and that is sealed and continuous to the outlet of the machine, advantageously making it possible to make sealed connections by thermoplastic fusion.

That insulation system is fully satisfactory as regards the inner connections. Unfortunately, it does not solve the problem of the exit electrical connection on the sealed feed-through connector. Such connections have very little protection from moisture, which appears as a source of possible insulation break-down in highly corrosive gas-processing environments.

DISCLOSURE OF INVENTION

An object of the present invention is thus to protect the electrical link between cables and connectors by sealing it in leak-tight manner in particular against moisture.

This object is achieved by an electrical connector making it possible to provide a sealed electrical link between an inside environment subjected to corrosive gases or liquids under pressure and an outside environment of different pressure, wherein said connector includes:
  a connector body designed to be secured to a structure and provided with gastight feed-throughs for receiving electrical contacts connecting said outside environment to said inside environment;
  conductor cables, each including an outer insulating layer made of a fusible thermoplastic material, which cables are connected to said electrical contacts inside said inside environment;
  a thermoplastic insulator surrounding said conductor cables and secured to said connector body, wherein at least a portion of said thermoplastic insulator is manufactured of a fusible thermoplastic material of the same type of fusible thermoplastic material as said outer insulating layers of said conductor cables, thus making it possible, by localized fusion, to form a thermoplastic weld between said at least a portion of said thermoplastic insulator and said outer insulating layers of said conductor cables; and
  a sealing element mounted between said connector body and said thermoplastic insulator.

Thus, the thermoplastic insulator protects the various contacts from any moisture contained in the gas present on the high-pressure side of the machine and that might give rise to a short-circuit.

Said sealing element may be constituted by said thermoplastic insulator, optionally supplemented by at least one O-ring seal held in compression by a nut screwed into said body of the connector via a bearing plate disposed against said thermoplastic insulator.

Preferably, a supply of oil is held captive between said connector body and said thermoplastic insulator so as not to offer any cavity that might be filled with gas under pressure, and so as to avoid any explosive depressurization.

Thus, in the event of a micro-leak at the thermoplastic weld, the oil pressurized by the process gases will not leave any space for any migration of gas.

In an alternative embodiment, said supply of insulating oil is enclosed in an expansion bellows, one end of which is secured to said connector body and another end of which is secured to said thermoplastic insulator. An O-ring seal may be provided so as to provide sealing between said end of said expansion bellows and said connector body to which it is secured, and said other end of said body of the expansion bellows is advantageously held pressed against said thermoplastic insulator by a cover secured to said connector body. An oil filling stopper is also provided for enabling said expansion bellows to be filled with said insulating oil at a determined pressure.

In another alternative embodiment, said supply of insulating oil is enclosed in a compensation balloon, one end of which forms a seal with said connector body and another end of which forms said thermoplastic insulator. Said end forming a seal is flattened against said body of the connector preferably by a holding flange in such a manner as to form a seal providing sealing between these two portions, and said other end forming said thermoplastic insulator is held pressed between a cover and said holding flange. Said holding flange preferably includes at least one vent for balancing the pressure on either side of the compensation balloon. An oil filling stopper is also provided for enabling said compensation balloon to fill with said insulating oil at a determined pressure.

The electrical connector of the invention may, for example be used in any of the following devices: an electric motor, a magnetic bearing, a magnetic bearing position sensor, and a magnetic bearing speed sensor.

BRIEF DESCRIPTION OF DRAWINGS

The characteristics and advantages of the present invention appear more clearly from the following description given by way of non-limiting indication, and with reference to the accompanying drawings, in which.

DETAILED DESCRIPTION

Figure 1:
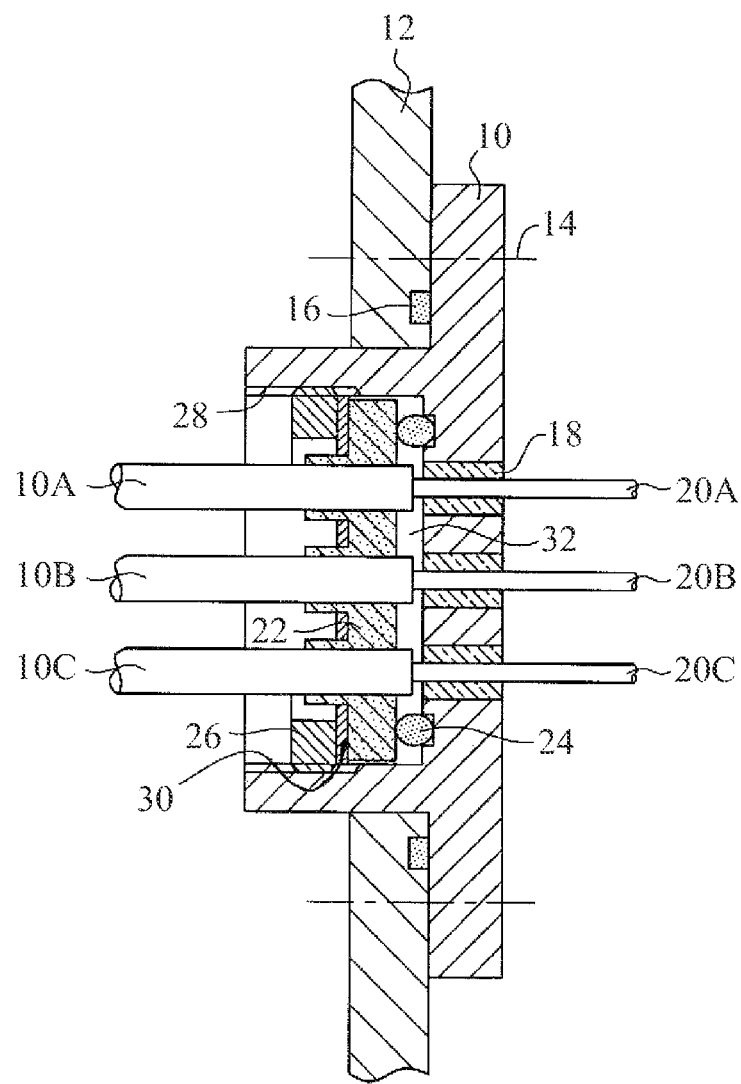
FIG. 1 shows a first embodiment of a sealed electrical connector of the invention.
Figure 2:
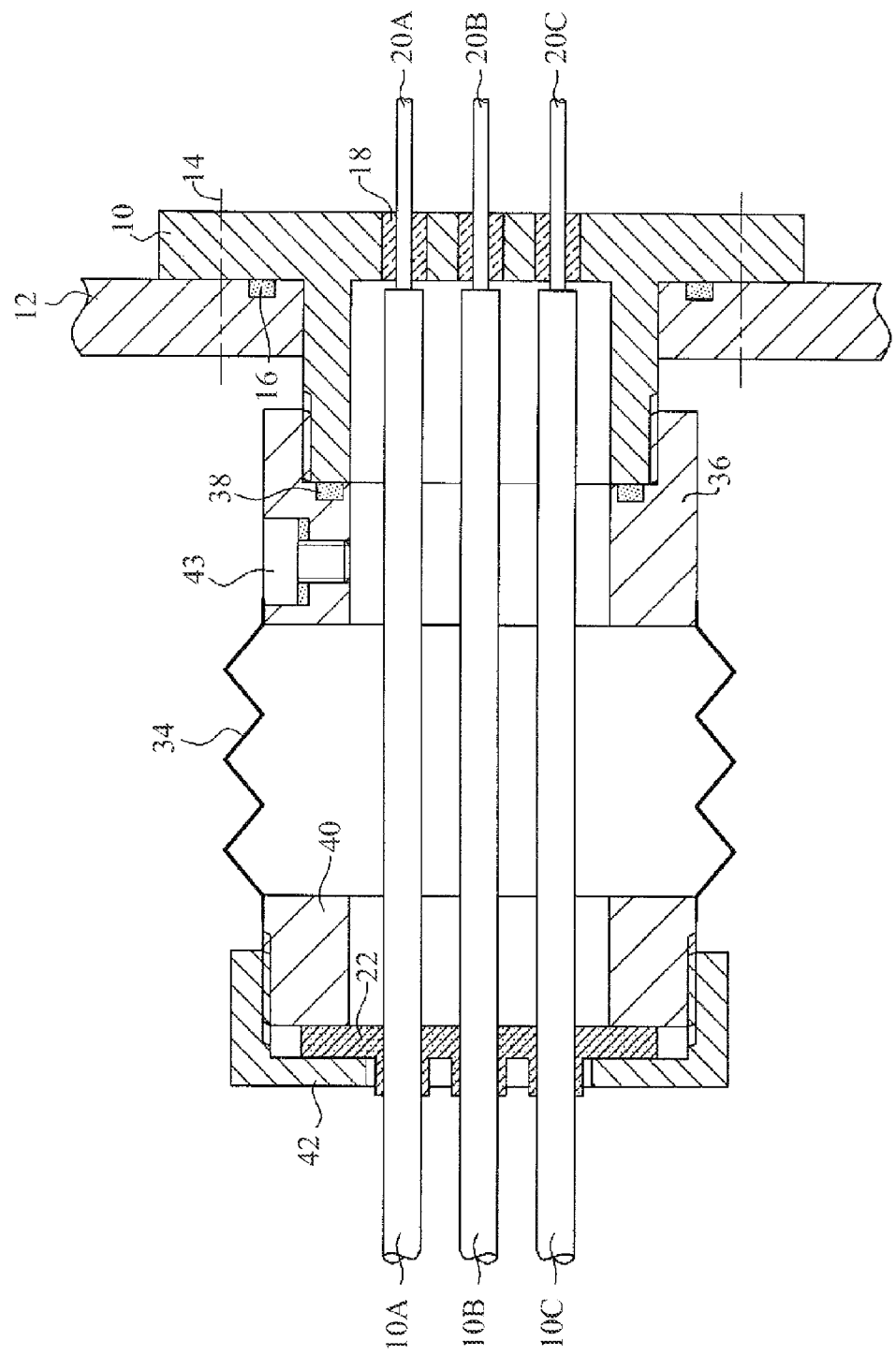
FIG. 2 shows a second embodiment of a sealed electrical connector of the invention.
Figure 3:
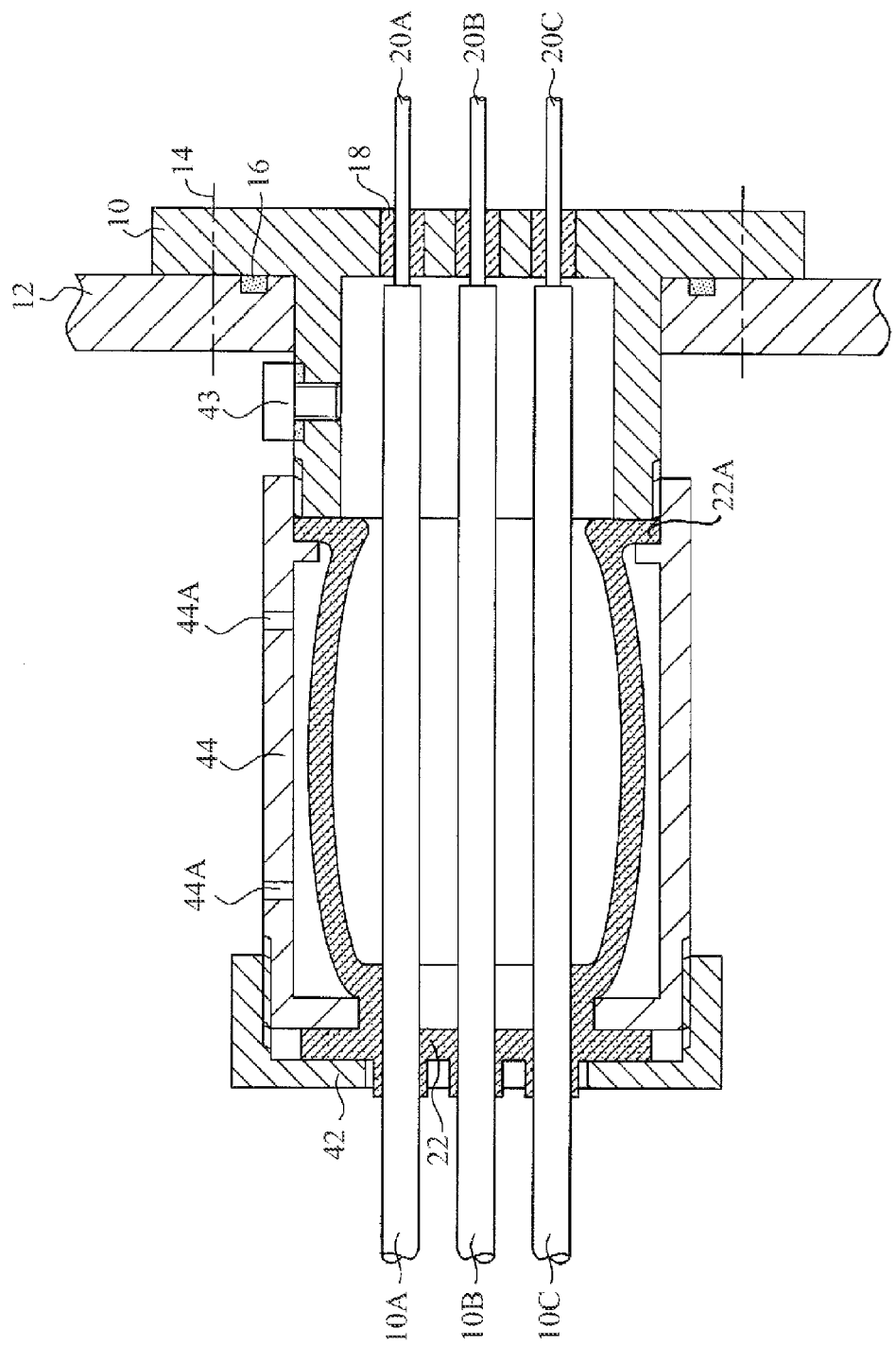
FIG. 3 shows a third embodiment of a sealed electrical connector of the invention.

As shown in the examples of FIGS. 1 to 3, the insulation of the conductor wires and/or cables 10A, 10B, 10C soldered to the contacts 20A, 20B, 20C of the sealed electrical connector 10 is based on the insulation described in Application EP 2 410 533 and including an optional, "inner" layer, formed of a chemically resistant polymer, extruded or deposited over the conductor wire or cable, and having a melting point very significantly greater than 300° C. and an "outer" insulating layer formed of a fusible polymer of the same type and extruded over said first layer or directly over the conductor wire/cable when said first layer is absent, which polymer has a melting point that is greater than the temperature to which the conductor wire/cable is subjected (operating temperature of the application), but that is very significantly lower than the melting point of the inner insulating layer.

In accordance with the invention, it is proposed to secure the connector to a part referred to as a "thermoplastic insulator" 22 in the description below, which insulator makes it possible to add the layer of fusible polymer making it possible to form a thermoplastic weld between the outer layer of insulation of the cables 10A, 10B, 10C and the thermoplastic insulator in order to protect the connection between the electrical cables and contacts from moisture, and in order to offset the sealing to be implemented at the link between the thermoplastic insulator and the body of the connector.

This insulator is made in such a manner as to adapt to the connector for which it is designed and its sole purpose is to protect the link between the electrical cables and the electrical contacts from the moisture of the gas under pressure in order to prevent said contacts from being grounded. The pressure barrier with the outside of the pressurized enclosure to which said connector is hermetically fastened remains procured by the connector itself.

The use of a fusible fluorinated polymer as an outer insulating layer for the cables, and as a thermoplastic insulator makes it possible to form such sealed connections between said conductor cables and the thermoplastic insulator by fusing the outer insulation of said cables over the insulator. Fusing the two layers is obtained by heating to a temperature greater than the melting point of the fusible insulating layer. The fusing can also be performed in a vacuum in order to avoid trapping bubbles or pockets of air in the connection, which bubbles or pockets could, following exposure in a pressurized environment result in explosive depressurization.

In addition, the use of this type of material offers the advantage of having very considerable chemical stability with a very large number of environments encountered in industrial applications in which magnetic bearings are found.

But, lack of gas-tightness is still possible and it is necessary to prevent pressurized gas from entering the insulator and the connector so as to avoid the risk of explosive depressurization.

Also, in accordance with the invention, it is also possible, in optional manner, to propose to use filling with insulating oil between the electrical contacts and said solders. The oil brought to the same pressure by the process gases then forms a barrier impermeable to said gases.

The embodiment shown in FIG. 1 corresponds to applications in which, if it is used, the insulating oil is not subjected to thermal expansion or is hardly subjected to thermal expansion. Variation in the working volume of oil is then minimized.

The body of the connector 10 held on a structure such as the wall of a pressurized enclosure 12 by link means 14 and having its gas-tightness guaranteed (for example) by seals 16, is provided with insulated and gastight feed-throughs 18 of the "glass bead" type for receiving electrical contacts 20A, 20B, 20C providing electrical continuity between the pressurized inside environment and the outside environment. In this structure subjected to a high-pressure corrosive process gas, the conductor wires or cables 10A, 10B, 10C connected to such contacts are insulated from one another and protected from the moisture of the process gas by the thermoplastic outer layers of said cables fusing in localized manner with the thermoplastic insulator 22 made of the material of the same type as the material surrounding them. This part is mounted in the body of the connector to which it should be secured. Preferably, at least one O-ring seal 24 is mounted between the body of the connector 10 and said thermoplastic insulator 22 and it is held in compression and in position by a clamping nut 26 screwed into internal tapping 28 in the body of the connector, a rigid washer 30 being disposed between said nut and the insulator in order to guarantee better distribution of the clamping force of the nut. The oil is disposed in the space 32 insulated by the O-ring seal 24 and separating the body of the connector 10 from the thermoplastic insulator 22.

In a variant embodiment, the sealing element can be constituted directly by the thermoplastic insulator 22 that is then held between the body of the connector 10 and the nut 26 forming the cover. As above, insulating oil can be enclosed in the empty space separating the connector body from the thermoplastic insulator.

When the temperature differences are large in operation, in particular in the oil & gas industry in which storage can be performed at as low as −50° C., operation can take place at 150° C. and shutdowns that are pressurized or otherwise, can take place at 20° C. for example, it is necessary to provide a more complex structure incorporating a flexible wall (allowing the oil to expand under the effect of temperature) that can be in the form of expansion bellows, as shown in FIG. 2, or, as shown in FIG. 3, that can be directly incorporated in the body of the thermoplastic insulator (and then forming a compensation balloon) so that expansion of the oil filling the thermoplastic insulator cannot stress the connections and the thermoplastic welds.

Thus, in FIG. 2 and as above, the body of the connector 10 held by the link means 14 on the wall of the pressurized enclosure 12 and rendered gastight by the seals 16 is provided with gastight feed-throughs 18 providing electrical continuity between the pressurized inside environment and the outside environment. Similarly, the conductor wires or cables 10A, 10B, 10C connected to such contacts are insulated from one another by the thermoplastic outer layers of said cables fusing in localized manner with the thermoplastic insulator 22 surrounding them and made of the same material. In this embodiment, the body of the connector 10 and this thermoplastic insulator 22 are separated by an expansion bellows 34 filled with insulating oil and in which one end of the body 36 is secured to the body of the connector, e.g. by screw-fastening, an O-ring seal 38 preferably procuring the sealing between these two portions. The other end 40 of the body of the expansion bellows is held pressed against the thermoplastic insulator 22 by a cover 42 that is secured to said body, e.g. by screw-fastening. An oil filling stopper 43 makes it possible to fill the bellows under the desired pressure to ensure that the cables 10A-10C are not stressed by the thermal expansion of the oil under the various operating conditions.

Similarly, with the embodiment of FIG. 3, the body of the connector 10 is also held by the link means 14 on the wall of the pressurized enclosure 12 that is rendered gastight by the seals 16. It is provided with gastight feed-throughs 18 for receiving the electrical contacts 20A, 20B, 20C of the outside environment. Similarly, the conductor wires or cables 10A, 10B, 10C connected to such contacts are insulated from one another by the thermoplastic outer layers of said cables fusing in localized manner with the thermoplastic insulator 22 surrounding them and made of the same material. However, in this embodiment, this thermoplastic insulator that is held pressed between the cover 40 and a holding flange 44 thus forms one end of a compensation balloon designed to be filled with insulating oil, and having its other end 22A flattened against the body of the connector 10 by the holding flange 44 so as to form a seal providing the sealing between these two portions. The oil filling stopper 43 that makes it possible to fill the balloon is mounted directly in the body of the connector 10, and, in order to balance the pressure on either side of the compensation balloon and in order to avoid any tearing, at least one vent 44A is provided through the holding flange 44.

Thus, with the invention and regardless of the embodiment, it is possible to avoid any micro-leak of the process gas through thermoplastic solders that might occur under extreme conditions due to the corrosive nature of the process gas or to the high operating pressures.

It should be noted that the invention is adaptable to most commercially available connectors provided that the thermoplastic insulator is adapted to the geometry of said connector (number of connections, and dimensions of the contacts).

In addition, in the event of failure of the sealing of the insulator 22, the body of the connector can be recovered, unlike what is possible with current solutions implementing an overmolded connector, because, once the electrical contacts have been cut and the conductor cables unsoldered, it suffices to change only the thermoplastic insulator (or the entire compensation balloon), a part that is inexpensive per se, unlike the body of the connector itself.

An example of materials that might be used to make the thermoplastic insulator is constituted by a fluoropolymer, such as Fluorinated Ethylene Propylene (FEP) or Perfluoroalkoxy (PFA). An advantage of these materials is that they are highly compatible with the environment, and that they withstand temperatures compatible with gas processing applications. However, it is possible to replace said materials with other thermoplastic materials as a function of the application. For example, it is possible to consider making provision for this thermoplastic insulator and the insulation of the cables that are to be connected to be made of Polyether Ether Ketone (PEEK), such a material being well known in the field of oil & gas for its compatibility with the environment, with the advantages of not presenting the toxicity of halogen materials such as fluorine.

What is claimed is:

1. An electrical connector configured to provide a sealed electrical link between an inside environment subjected to corrosive gases or liquids under a first pressure and an outside environment of a second pressure, the electrical connector comprising:
   a connector body configured to be hermetically secured to a pressurized enclosure separating the inside environment and the outside environment to create a pressure barrier with an outside of the pressurized enclosure and comprising gastight feed-throughs configured to receive electrical contacts connecting said outside environment to said inside environment;
   conductor cables connected to said electrical contacts within said inside environment, each conductor cable comprising an outer insulating layer, the outer insulating layer comprising a fusible thermoplastic material;
   a thermoplastic insulator surrounding said conductor cables and secured to said connector body, at least a portion of said thermoplastic insulator comprising the fusible thermoplastic material;
   a thermoplastic weld based on a localized fusion between said at least a portion of said thermoplastic insulator and said outer insulating layers of said conductor cables, wherein the thermoplastic weld is configured to protect the connection between the conductor cables and electrical contacts from moisture crossing the pressure barrier;
   a space defined by a separation between the connector body and the thermoplastic insulator comprising a supply of insulating oil held captive between said connector body and said thermoplastic insulator,
   wherein the thermoplastic insulator constitutes a removable sealing element, secured with respect to the connector body by a screw-fastening element, that enables the connector body to remain hermetically secured to the pressurized enclosure when protection of the connection fails; and a cover secured to said connector body, wherein the cover is the screw-fastening element.

2. An electrical connector according to claim 1, wherein said removable sealing element is constituted by said thermoplastic insulator held against at least one O-ring seal in compression by the screw-fastening element.

3. An electrical connector according to claim 1, wherein said space is further defined by an expansion bellows, one end of which is secured to said connector body and another end of which is secured to said thermoplastic insulator.

4. An electrical connector according to claim 3, further including an O-ring seal for providing sealing between said end of said expansion bellows and said connector body to which it is secured.

5. An electrical connector according to claim 3, wherein said other end of said body of the expansion bellows is held pressed against said thermoplastic insulator by the cover secured to said connector body.

6. An electrical connector according to claim 3, further including an oil filling stopper for enabling said expansion bellows to be filled with said insulating oil at a determined pressure.

7. An electrical connector according to claim 1, wherein said supply of insulating oil is enclosed in a compensation balloon, one end of which forms a seal with said connector body and another end of which forms said thermoplastic insulator.

8. An electrical connector according to claim 7, wherein said end forming a seal is flattened against said body of the connector by a holding flange in such a manner as to form a seal providing sealing between these two portions.

9. An electrical connector according to claim 8, wherein said other end forming said thermoplastic insulator is held pressed between the cover and said holding flange.

10. An electrical connector according to claim 8, wherein said holding flange includes at least one vent for balancing the pressure on either side of the compensation balloon.

11. An electrical connector according to claim 7, further including an oil filling stopper for enabling said compensation balloon to filled with said insulating oil at a determined pressure.

12. An electrical connector according to claim 1, wherein the supply of insulating oil is at the first pressure to create a barrier impermeable to the corrosive gases or liquids.

13. An electrical connector and respective installation configured to provide a sealed electrical link between an inside environment subjected to corrosive gases or liquids under a first pressure and an outside environment of a second pressure, the electrical connector comprising:

a connector body configured to be hermetically secured to a pressurized enclosure separating the inside environment and the outside environment to create a pressure barrier with an outside of the pressurized enclosure and comprising gastight feed-throughs configured to receive electrical contacts connecting said outside environment to said inside environment;

conductor cables connected to said electrical contacts within said inside environment, each conductor cable comprising an outer insulating layer, the outer insulating layer comprising a fusible thermoplastic material;

a thermoplastic insulator surrounding said conductor cables and secured to said connector body, at least a portion of said thermoplastic insulator comprising the fusible thermoplastic material;

a thermoplastic weld based on a localized fusion between said at least a portion of said thermoplastic insulator and said outer insulating layers of said conductor cables, wherein the thermoplastic weld is configured to protect the connection between the conductor cables and electrical contacts from moisture crossing the pressure barrier;

a space defined by a separation between the connector body and the thermoplastic insulator comprising a supply of insulating oil held captive between said connector body and said thermoplastic insulator, wherein the thermoplastic insulator is changeable to enable the connector body recoverable when the protection of the connection fails, wherein the thermoplastic insulator constitutes a removable sealing element, secured with respect to the connector body by a screw-fastening element, that enables the connector body to remain hermetically secured to the pressurized enclosure when the protection of the connection fails; and a cover secured to said connector body, wherein the cover is the screw-fastening element, wherein the electrical connector is integrated into any one of the following devices:

an electric motor, a magnetic bearing, a magnetic bearing position sensor, and a magnetic bearing speed sensor.

14. An electrical connector according to claim 13, wherein said removable sealing element is constituted by said thermoplastic insulator held against at least one O-ring seal in compression by the screw-fastening element.

15. An electrical connector according to claim 13, wherein said space is further defined by an expansion bellows, one end of which is secured to said connector body and another end of which is secured to said thermoplastic insulator.

16. An electrical connector according to claim 15, further including an O-ring seal for providing sealing between said end of said expansion bellows and said connector body to which it is secured.

17. An electrical connector according to claim 15, further including an oil filling stopper for enabling said expansion bellows to be filled with said insulating oil at a determined pressure.

* * * * *